(12) United States Patent
Tsai et al.

(10) Patent No.: US 12,707,590 B2
(45) Date of Patent: Aug. 11, 2026

(54) COMMON FILLER FOR MOUNTING CAGES HAVING DIFFERENT DIMENSIONS

(71) Applicant: HEWLETT PACKARD ENTERPRISE DEVELOPMENT LP, Spring, TX (US)

(72) Inventors: I-Che Tsai, Taipei City (TW); Chen-Ruei Tu, New Taipei City (TW); Chi-Ting Yang, New Taipei City (TW)

(73) Assignee: Hewlett Packard Enterprise Development LP, Spring, TX (US)

( * ) Notice: Subject to any disclaimer, the term of this patent is extended or adjusted under 35 U.S.C. 154(b) by 89 days.

(21) Appl. No.: 18/791,947

(22) Filed: Aug. 1, 2024

(65) Prior Publication Data

US 2026/0040478 A1 Feb. 5, 2026

(51) Int. Cl.
*H05K 7/00* (2006.01)
*H05K 7/14* (2006.01)

(52) U.S. Cl.
CPC .................................. *H05K 7/1489* (2013.01)

(58) Field of Classification Search
CPC .................................................... H05K 7/1489
See application file for complete search history.

(56) References Cited

U.S. PATENT DOCUMENTS 6,122,173 A * 9/2000 Felcman .................. G06F 1/16 312/223.1
6,580,604 B1 * 6/2003 McAnally ............ G11B 33/128
6,906,915 B2 * 6/2005 Tucker .................... G06F 1/181 361/679.33
7,190,574 B2 * 3/2007 Muenzer ................. G06F 1/184 361/679.33
7,190,575 B1 * 3/2007 Baik ....................... G06F 1/187
7,200,003 B2 * 4/2007 Hood ...................... G06F 1/184 361/679.33
7,275,935 B2 10/2007 Chen et al.
7,312,999 B1 * 12/2007 Miyamura .............. G06F 1/181
7,342,780 B2 * 3/2008 Scicluna .............. G11B 33/128

(Continued)

OTHER PUBLICATIONS

Ami, “MG9100 NVMe SSD Universal Backplane Managment (UBM) Controller for NVMe/SATA/SAS Backplanes,” Oct. 13, 2023, https://f.hubspotusercontent10.net/hubfs/9443417/Data_Sheets/Backplane_Controllers/AMI_Backplane_Controller_MG9100_Data_Sheet_PUB.pdf.

(Continued)

*Primary Examiner* — Rockshana D Chowdhury
(74) *Attorney, Agent, or Firm* — Jones Burke, PLLC

(57) ABSTRACT

An information processing system comprises an information processing device. The processing device further includes a chassis defining a drive cage receptacle and information processing circuitry housed in the chassis. The drive cage comprises a module housing and a filler, with pluggable modules being insertable in the module housing. The drive cage is installable in the drive cage receptacle. Moreover, the pluggable modules are electrically connected to the information processing circuitry. If the dimensions of the module housing vary, then the dimensions of an unoccupied portion of the drive cage change as a result. The same filler is configured to fit in the variable unoccupied portion of the drive cage by changing the position of the filler respective to the drive cage, such as by rotating the filler around a filler axis respective to the drive cage.

20 Claims, 9 Drawing Sheets

(56) References Cited

U.S. PATENT DOCUMENTS

| | | | | |
|---|---|---|---|---|
| 7,453,706 | B2 * | 11/2008 | Clark | H05K 7/1448 361/796 |
| 7,599,183 | B2 * | 10/2009 | Dittus | H05K 7/20727 361/728 |
| 7,609,509 | B2 * | 10/2009 | Wu | G06F 1/187 361/679.33 |
| 7,733,640 | B2 * | 6/2010 | Huang | G11B 33/127 361/679.33 |
| 8,369,081 | B2 * | 2/2013 | Chen | G11B 33/128 312/223.1 |
| 8,369,092 | B2 * | 2/2013 | Atkins | G06F 1/187 361/730 |
| 9,652,001 | B2 * | 5/2017 | Wang | G06F 1/187 |
| 10,212,842 | B1 * | 2/2019 | Schulze | G11B 33/128 |
| 10,264,701 | B1 * | 4/2019 | Norton | H05K 7/1424 |
| 11,229,140 | B2 * | 1/2022 | Choyikkunnil | G11B 33/128 |
| 11,369,030 | B2 * | 6/2022 | Hashimoto | H05K 3/366 |
| 11,714,464 | B2 * | 8/2023 | Ball | G11B 33/122 361/679.31 |
| 11,744,033 | B2 * | 8/2023 | Hur | H05K 7/12 361/679.32 |
| 12,178,010 | B2 * | 12/2024 | Berkenbush | H05K 7/1418 |
| 12,309,960 | B2 * | 5/2025 | Lin | G06F 1/183 |
| 12,484,180 | B2 * | 11/2025 | Alvarado | H05K 7/1489 |
| 2004/0031767 | A1 * | 2/2004 | Ice | H05K 7/1425 211/41.17 |
| 2007/0029902 | A1 * | 2/2007 | Selvidge | G11B 33/128 |
| 2008/0158810 | A1 * | 7/2008 | Liu | G06F 1/187 |
| 2008/0165490 | A1 * | 7/2008 | Buckland | G11B 33/128 |
| 2011/0005068 | A1 * | 1/2011 | Zhang | H05K 7/18 29/729 |
| 2011/0261526 | A1 * | 10/2011 | Atkins | G06F 1/187 361/679.33 |
| 2013/0021744 | A1 * | 1/2013 | Sun | H05K 7/1487 361/679.33 |
| 2013/0164490 | A1 * | 6/2013 | Sun | G06F 1/187 428/101 |
| 2019/0174642 | A1 * | 6/2019 | Choyikkunnil | H05K 5/10 |
| 2021/0132667 | A1 * | 5/2021 | Wong | G06F 1/183 |
| 2021/0385961 | A1 * | 12/2021 | Hsieh | H05K 7/1407 |

OTHER PUBLICATIONS

Cisco, "Cisco UCS C240 M5 Server Installation and Service Guide," Jul. 14, 2017, https://www.cisco.com/c/en/us/td/docs/unified_computing/ucs/c/hw/C240M5/install/C240M5/C240M5_chapter_010.html, 184 pages.

Lenovo, "Lenovo ThinkSystem SR650 V2 Server," May 22, 2024, Product Guide, https://lenovopress.lenovo.com/lp1392-thinksystem-sr650-v2-server, 133 pages.

Plank, J., "Using Universal Backplane Management (SFF-TA-1005) to Enable Tri-Mode Backplanes," 2019, Session: SSDS-102-1.

* cited by examiner

FIG. 1

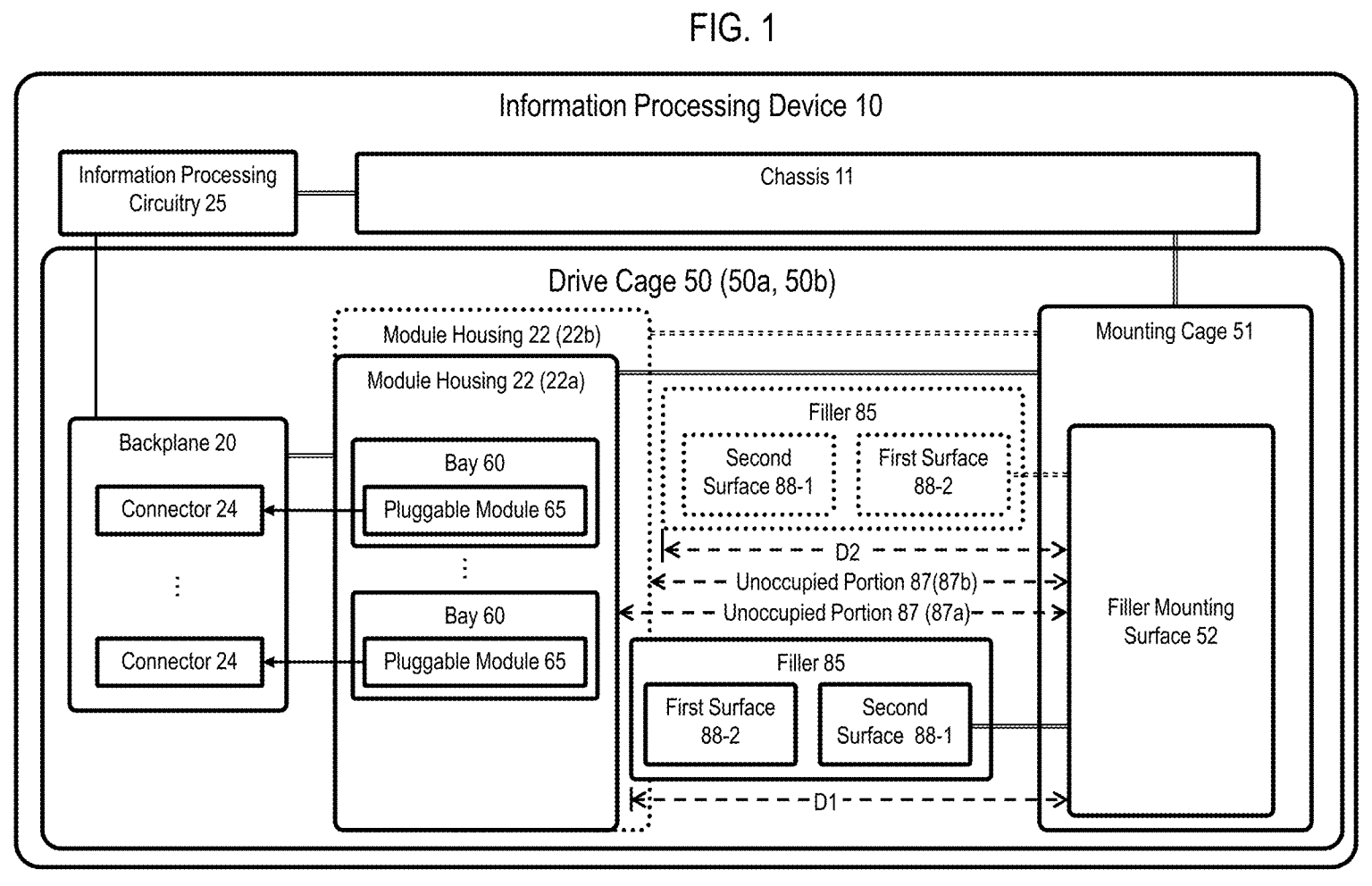

Information Processing Device 10

Chassis 11

Information Processing Circuitry 25

Drive Cage 50 (50a, 50b)

Mounting Cage 51

Filler Mounting Surface 52

Filler 85

First Surface 88-2

Second Surface 88-1

D2

Unoccupied Portion 87(87b)

Unoccupied Portion 87 (87a)

Filler 85

Second Surface 88-1

First Surface 88-2

D1

Module Housing 22 (22b)

Module Housing 22 (22a)

Bay 60

Pluggable Module 65

...

Bay 60

Pluggable Module 65

Backplane 20

Connector 24

...

Connector 24

P1

P2
d1
d2
d3
271_1
273
288-1
288-2
285
271_2
299
X
Y
Z

COMMON FILLER FOR MOUNTING CAGES HAVING DIFFERENT DIMENSIONS

INTRODUCTION

Information processing devices, such as computers, generally comprise a variety of components, including, among others, media drives, such as hard disk drives (HDD) or solid-state drives (SSD). In some computers, the media drives are configured as pluggable modules, which are designed to be installable and removable from the computer without requiring disassembly of the computer. In some cases, the drives are removable/installable while the computer is still powered on, which is also referred to as being hot-swappable. For example, the computer may comprise a chassis, and the chassis may include a drive cage which has a number of bays which are accessible from an exterior of the chassis and are each configured to removably receive a media drive. A backplane may be provided at the rear of the drive cage, with blind-mate electrical connectors being disposed on the backplane in alignment with the bays such that, as drives are inserted into the bays, electrical connectors of the drives automatically engage with the backplane connectors. The backplane is also electrically connected to other components of the system, such as a CPU, and thus the installed drives are electrically connected to these other components via the backplane.

Pluggable modules vary in form factor, and the drive cages that receive these modules may have different dimensions and/or configurations relative to one another as a result. Moreover, the dimensions or other attributes (e.g., connector locations) of the backplane can vary from one backplane to another, and this too may necessitate the drive cages which utilize these backplanes having different dimensions and/or other configurations relative to one another.

BRIEF DESCRIPTION OF THE DRAWINGS

The present disclosure can be understood from the following detailed description, either alone or together with the accompanying drawings. The drawings are included to provide a further understanding of the present disclosure and are incorporated in and constitute a part of this specification. The drawings illustrate one or more examples of the present teachings and together with the description explain certain principles and operations. In the drawings:

FIG. 1 is a block diagram schematically illustrating an information processing device with a drive cage comprising a filler installable in multiple installation configurations.

FIGS. 5A-6B comprise comparative views of two drive cages comprising different module housings. FIGS. 5A, 5B, and 6A depict the drive cage of FIG. 2 and/or its pluggable module, whereas FIGS. 5C, 5D, and 6B depict the drive cage of FIG. 4 and/or its pluggable module. More specifically, FIG. 5A is a perspective view of the drive cage of FIG. 2, FIG. 5B is a side view of a module housing of the drive cage in isolation, and FIG. 6A is a front view of the drive cage with pluggable modules omitted. FIG. 5C is a perspective view of the drive cage of FIG. 4, FIG. 5D is a side view of a module housing of the drive cage in isolation, and FIG. 6B is a front view of the drive cage with pluggable modules omitted.

DETAILED DESCRIPTION

Figure 2:
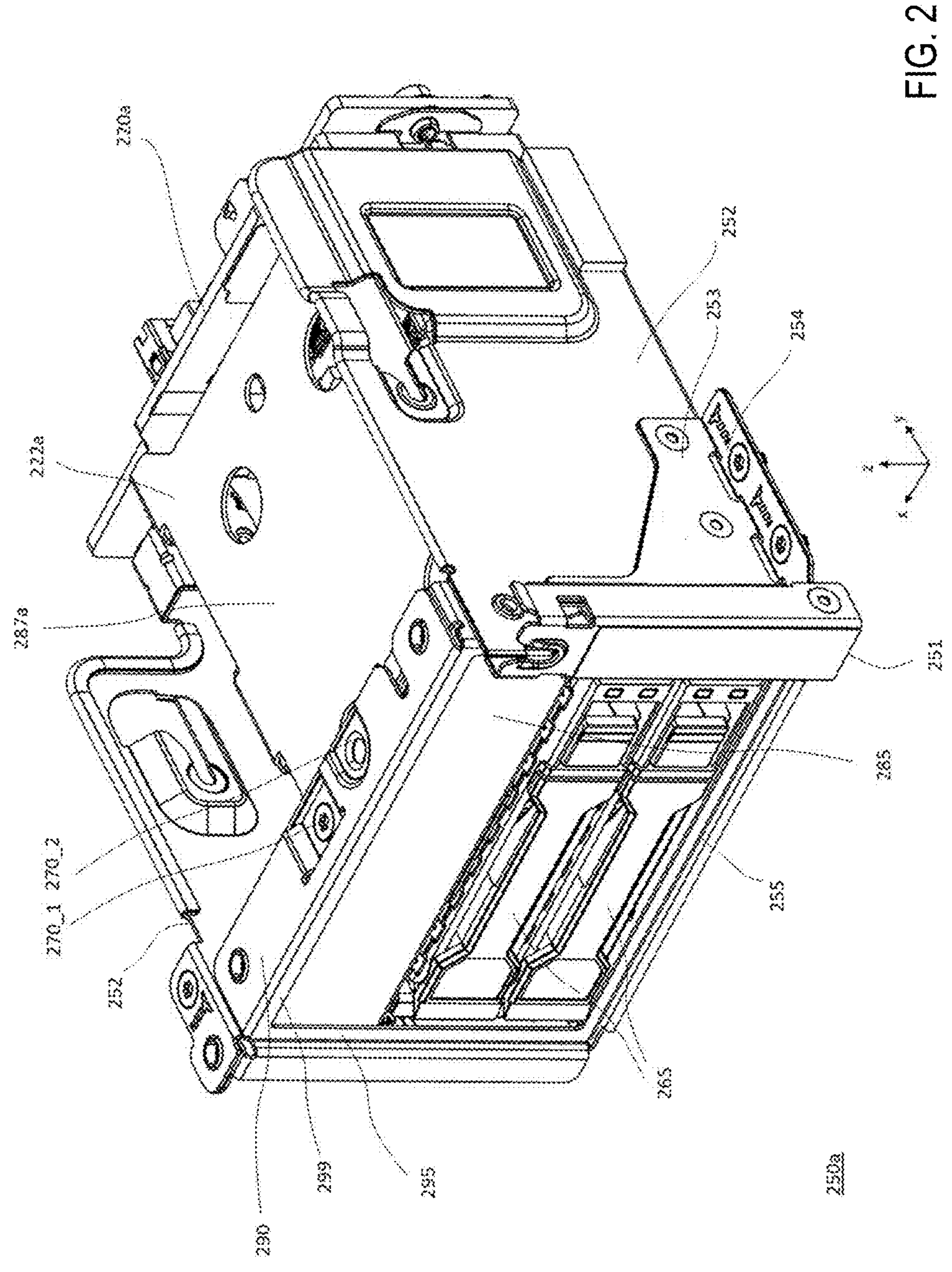
FIG. 2 is a perspective view of another drive cage comprising a frame and a filler in a first installation configuration, with pluggable modules in the drive cage.

Some drive cages comprise a mounting cage, which is affixed to the chassis of the information processing device, and a module housing, which is placed inside of and affixed to the mounting cage. The module housing is to receive and house the pluggable modules. In some drive cages, the module housing does not fill all of the space inside the mounting cage, and thus there is an unoccupied portion of the drive cage between module housing and the mounting cage. This may result in a front face of the drive cage having a gap or opening which can allow electromagnetic interference (EMI) to enter or leave the information processing device and can also disturb desired airflow patterns (e.g., allowing air to bypass the devices the air is intended to cool). Accordingly, some drive cages are provided with a filler, which covers the opening into the unoccupied portion of the drive cage.

In some circumstances, different drive cages may have differently sized unoccupied portions between their module housing and their mounting cage. This may happen when, for example, the drive cages utilize the same size of mounting cage but differently sized module housing. The drive cages may use differently sized module housings, for example, because they are designed for use with different backplanes and/or different form factors of pluggable modules. However, because the size of the unoccupied portion may vary as between drive cages (or when retrofitting an existing drive cage to a new design), then differently sized fillers may be needed for those drive cages in order to properly cover their respective gaps. Thus, generally, the variation of the filler requirements results in different fillers being manufactured for different drive cages. In addition to the potential inefficiencies in designing different versions of the filler piece, there is a need to create multiple sets of tooling required to produce multiple filler versions, with each set of tooling being quite costly. For example, each different filler requires specific tools, dies, molds, jigs, fixtures, etc., used to shape, cut, form, and assemble materials, such as metal, plastic, etc., into finished fillers.

To address these and other issues, examples disclosed herein include a mounting cage and a filler for a drive cage which can be assembled together in multiple different configurations so as to allow the filler to cover differently sized openings. The mounting cage and the filler can be assembled together with any one of multiple differently sized module housings to form a drive cage, thus allowing the same mounting cage and filler design to be shared among multiple different drive cages. These different drive cages may have differently sized unoccupied portions, and the filler is adaptable to cover these variably sized unoccupied portions . . . . In other words, the filler is configured to be able to fit in and substantially cover the variable unoccupied portion of the drive cage (the gap between the module hosing and the mounting cage) even when the dimensions of the remainder of the drive cage vary. In this way, it is unnecessary to make different fillers for different types of drive cages having different gap sizes. Consequently, the same tooling can be used for manufacturing but one filler.

This interchangeable usage of the filler to fill variably sized openings is achieved, in part, by the filler being capable of attaching to the mounting cage in multiple different orientations, with the filler extending a different distance across the opening depending on the orientation of the filler. For example, in some implementations, by rotating the filler around an axis respective to the drive cage, alternate surfaces of the filler may be positioned facing a top plate of a frame of the mounting cage, with these surfaces of the filler being attachable to the top plate and respectively causing the top plate to extend different distances across the opening. For example, the surfaces of the filler may have different sets of attachment features which engage with corresponding attachment features of the top plate, and these attachment features may all be configured with varying height profiles relative to the top plate so that a position of the filler relative to the top plate is variable depending upon which set of attachment features is used to attach the filler to the top plate. Thus, the filler can cover differently sized gaps depending on which orientation it is disposed in (or in other words, depending on which attachment features are used to attach it to the frame). For example, in some implementations there are two sets of attachment features disposed on two opposite surfaces of the filler, allowing the filler to be rotated 180 degrees to switch between two different installation configurations of the filler which result in two different positions for the filler relative to the frame. In other implementations, there may be attachment features disposed on more than two surfaces thereof, which may allow the filler to cover more than two differently sized gaps.

As explained above, in some examples, each pair of corresponding attachment features of the filler and frame may have a different height profile than the other pairs of attachment features. In some examples, these differences in height profile may result from the attachment features of frame having varying heights relative to the top plate of the frame. In other examples, the attachment features of the filler having varying heights relative to the respective surfaces they are arranged upon. In other examples, the attachment features of both filler and frame may have varying heights relative to the respective surfaces upon which they are disposed.

For example, in some implementations, the top plate of the frame includes one or more recess portions that are recessed toward the bottom of the frame. These recess portions may form some or all of the attachment features of the frame. The recessed portions are recessed to different depths, and thus the attachment features of the filler may all be located at different heights relative to one the bottom of the frame. Moreover, these recessed portions are disposed at different locations so as to align with their respectively corresponding filler attachment features, thus allowing the recessed portions to engage with the corresponding attachment features on the different sides of the filler, depending on what side of the filler is rotated and turned to interface with the frame.

In examples in which the frame comprises recessed portions which form part of the attachment features, the recess portions may include (or receive) corresponding latches, with the latches extending down in the unoccupied portion of the drive cage to engage with the filler's attachment features. The latches could be screws, rivets, hooks, or any other attachment mechanism deemed suitable.

In examples in which the frame comprises recessed portions which form part of the attachment features, a deeper recessed portion may interfere with the filler when it is attempted to engage the filler with a shallower recessed portion. To prevent such interference, one of the sides of the filler which has the attachment that is intended to engage with the shallower recessed portion may also include a keyhole. In such instance, when the filler is oriented so that the correct attachment feature can engage with the shallower recessed portion, the other, deeper recessed portion penetrates through the keyhole into a body of the filler, thereby allowing the surface of the filler which carries the correct attachment feature to move upward past the deeper recess and to engage with the shallower recessed portion. Thus, the overall process of installing the filler in the drive cage can be relatively simple while using the same filler for multiple drive cages which may have different gap sizes.

Turning now to the figures, various devices, systems, and methods in accordance with aspects of the present disclosure will be described.

FIG. 1 is a block diagram schematically illustrating an information processing device 10. It should be understood that FIG. 1 is not intended to illustrate specific shapes, dimensions, or other structural details accurately or to scale, and that implementations of the information processing device 10 may have different numbers and arrangements of the illustrated components and may also include other parts that are not illustrated. In FIG. 1, certain physical connections or engagements between components are indicated by doubled lines (solid or dashed), whereas electrical connections are indicated by single lines (solid or dotted). In addition, dotted lines are used in FIG. 1 to indicate alternative configurations of the device 10.

As shown in FIG. 1, the information processing device 10 comprises a chassis 11, information processing circuitry 25, and a drive cage 50. The drive cage 50 can have multiple configurations, as will be described below, which may include at least first configuration and a second configuration. The drive cage 50 in the first configuration may also be referred to as the drive cage 50*a*, while the drive cage 50 in the first configuration may also be referred to as the drive cage 50*b*.

The information processing device 10 may be a computer (e.g., server), networking device, or any other type of information processing device. The drive cage 50 is configured to carry multiple pluggable modules 65 which may include media (e.g., HDD, SDD, etc.) or other pluggable modules such as optical transceivers, Open Compute Project (OCP) cards, etc. The drive cage 50 may be fixedly attached to and/or form an integral part of the chassis 11 of the information processing device 10. The chassis 11 comprises one or more walls, panels, and/or other structural members which support and house the components of the device 10. The backplane 20 has blind-mate electrical connectors 24 mounted thereon and positioned so as to engage with complementary connectors of the pluggable modules 65. The number and arrangement of blind-mate connectors 24 may correspond to the number and arrangement of drive bays 60 (discussed below) in the drive cage 50. The connectors 24 of the backplane 20 are electrically connected to information processing circuitry 25 of the device 10, such as a CPU, and thus the pluggable modules 65 are electrically connected with the information processing circuitry 25 via the connectors 24 when the drive cage 50 is installed.

The drive cage 50 comprises a mounting cage 51, a module housing 22, a filler 85, and a backplane 20. The mounting cage 51 is structural frame formed from a plurality of outer structural members (walls, brackets, etc.) that partially encloses and defines an internal space. The module housing 22 is disposed within this internal space of the mounting cage 51 and attached thereto. The mounting cage 51 is attached to the chassis 11 and serves as a structural support for the remainder of the drive cage 50. The mounting cage 51 also may provide attachment points that allow other structures (such as other drive cages, expansion cards, etc.) to couple with the mounting cage 51.

The module housing 22 comprises a box-like structure that partially encloses and defines an internal space configured to receive pluggable modules 65 in multiple internal drive bays 60. Each of the drive bays 60 is configured to removably receive, hold, and support a pluggable module 65. In some examples, the module housing 22 may comprise top, bottom, and two side walls. An opening may be provided in a front face of the module housing 22 to allow for pluggable modules 65 to be inserted into and removed from the module housing 22. In addition, a rear face of the module housing 22 is at least partially open so as to expose electrical connectors at the rear of the pluggable modules 65. The backplane 20 is positioned adjacent to, and in some cases is attached to, the rear face of the module housing 22. The bays 60 are configured to hold the pluggable modules 65 in predetermined positions such that their electrical connectors will be properly aligned with, and thus can engage with, the electrical connectors 24 of the backplane 20.

As noted above, the drive cage 50 is capable of multiple different configurations. These configurations of the drive cage 50 may each include a different version of the module housing 22, with the different versions of the module housing 22 having different sizes (i.e., varying from one another in at least one dimension). For example, the drive cage 50*a* in a first configuration may include a version of the module housing 22 having a first size (also referred to as module housing 22*a*), whereas the drive cage 50*b* in a second configuration may include a version of the module housing 22 having a second size (also referred to as module housing 22*b*). Although only two configurations of the drive cage 50 and the two versions of the module housing 22 associated therewith are illustrated for ease of understanding, the drive cage 50 could have more than two configurations with more than two versions of the module housing 22. In some examples, the same mounting cage 51 may be configured to accommodate multiple different versions of the module housing 22, notwithstanding their differences in dimension.

The different versions of the module housing 22 may have different dimensions from one another for a variety of reasons. For example, two different module housings 18 may be designed for use with different form factors of pluggable modules 65, and because different form factors of pluggable modules 65 may have different dimensions, the module housing 22 designed to receive them may need different dimensions. As another example, two different module housings 18 may be designed for use with two different backplanes 20, and these backplanes 20 may have features which require the module housings 18 to have different dimensions (even if the same form factor of pluggable modules 65 are used). For example, one backplane 20 may have a pitch (separation distance) between its connectors 24, whereas another backplane 20 may have a different pitch between its connectors 24, thus resulting in differences in the amount of space which is needed to contain the pluggable modules 65.

In some instances, the module housing 22 and the pluggable modules 65 accommodated in the bays 60 do not occupy the entirety of the interior space of the drive cage 50, resulting in an unoccupied portion 87 of the drive cage 50 being formed. The unoccupied portion 87 comprises the space between one side of the module housing 22 and a corresponding side of the mounting cage 51—e.g., the space between a top side of the module housing 22 and a top side of the mounting cage 51. (The term "unoccupied" in unoccupied portion 87 means that the space in this portion is not occupied by any pluggable modules 65 or bays 60 for receiving such pluggable module 65, and should not be misunderstood as implying that there are no objects in the space. In some cases, there may be miscellaneous objects protruding into the unoccupied portion 87, such as the filler 85.) There may be an opening in the mounting cage 51 which corresponds to the unoccupied portion 87, and this opening may disrupt desired airflow patterns and/or allow for EMI leakage, and therefore a filler 85 is inserted in the unoccupied portion 87 of the drive cage 50 to cover this opening. The filler 85 is attached to a filler mounting surface 52 of the mounting cage 51. The filler mounting surface 52 may be part of a top plate of a frame of the mounting cage 51, wherein the frame encircles an opening in a front face of the drive cage 50 through which pluggable module 65 are inserted into the drive cage 50.

As noted above, the module housing 22 varies in size (depending on which version of the module housing 22 is used), and thus the amount of space occupied by the module housing 22 may vary from one configuration of the drive cage 50 to another. As the size of the portion of the drive cage 50 occupied by the module housing 22 varies, so does the size of the unoccupied portion 87. For example, as shown in FIG. 1, if a first version of the module housing 22*a* having a first size is used, then the unoccupied portion 87 may have a third size (referred to herein as unoccupied portion 87*a*), whereas if a second version of the module housing 22*b* having a second size is used, then the unoccupied portion 87 may have a fourth size (referred to herein as unoccupied portion 87*b*). Accordingly, the size of the opening into the unoccupied portion 87 which the filler 85 needs to cover will vary from one configuration of the drive cage 50 to another.

In alternative approaches, the variation in size of the unoccupied portion between different configurations of drive cage may result in different fillers being manufactured for each different drive cage configuration. In addition to the potential inefficiencies in making different versions of the filler piece, there is a need to create multiple sets of tooling required to produce multiple filler versions. For example, each filler requires specific tools, dies, molds, jigs, fixtures, etc., used to shape, cut, form, and assemble materials, such as metal, plastic, etc., into finished fillers. Having a precise set of tooling is necessary to meet the required specifications and quality standards of the filler. However, it may be cost ineffective to have multiple tooling sets for making various fillers, and such excess could be eliminated if a same filler 85 can be applied to fit with different pluggable modules or backplanes in the drive cage. Accordingly, one tooling set can be used to make the same filler to achieve multiple purposes.

In contrast, in some examples, the filler 85 is configured to be used to fit in multiple different sizes of the variable unoccupied portion 87 of the drive cage 50 even when the dimensions of the remainder of the drive cage 50 vary. To accommodate this variation in the size of the unoccupied portion 87, the filler 85 is capable of being installed in multiple installation configurations, with the filler 85 extending different distances from the filler mounting surface 52, and thus being capable of covering differently sized unoccupied portions 87, depending on which installation configuration is used. In this way, it is unnecessary to make different fillers 85 for free spaces of different dimensions within the drive cage 50. Consequently, the same tooling can be used for manufacturing but one filler 85. This interchangeable usage of the filler 85 is achieved by rendering the filler 85 capable of fitting in the varying unoccupied portion of the drive cage 50 by varying position of the filler 85 respective to the drive cage 50, as will be described in detail below.

In some examples, in each installation configuration of the filler 85, a different surface of the filler 85 faces and is attached to the filler mounting surface 52 of the mounting cage 51. Thus, in such examples, the filler 85 can be changed between installation configurations by rotating the filler 85 about an axis thereof. The filler 85 and cage 51 are configured such that each orientation of the filler 85 results in the filler 85 extending a different distance across the unoccupied portion 87 (the distances being measured from the filler mounting surface 52 to the side of the filler 85 closest to the module housing 22). In some examples, the filler 85 is disposed in different positions relative to the filler mounting surface 52 in the respective installation configurations. In these different positions of the filler 85, the filler 85 extends different distances across the unoccupied portion 87 thus allowing the filler 85 to fill different sizes of unoccupied portion 87 depending on the installation configuration of the filler. In some examples, both the orientation and the position of the filler 85 vary between the installation configurations, with a change in orientation of the filler 85 causing a change in position of the filler 85.

In some examples, different sets of attachment features are used to attach the filler 85 to the filler mounting surface 52 in the respective installation configurations, and these different sets of attachment features may have different height profiles relative to the filler mounting surface 52. In other words, each set of attachment features is arranged to, when used to attach the filler 85 to the cage 51, hold the filler 85 at a particular height relative to the filler mounting surface 52, and these heights vary from one set of attachment feature to the next. In some examples, each set of attachment features include a filler attachment feature coupled to a corresponding surface 88 of the filler 85 and a cage attachment feature coupled to the filler mounting surface 52. The attachment features may include, for example, recess portions and/or protruding portions which are recessed/protruded from the surfaces 88 of the filler 85 and/or from the filler mounting surface 52, with the depth/height of the recesses/protrusions varying from one set of attachment features to the next. For each set of attachment features, the filler attachment feature and the attachment feature thereof are arranged so as to engage with one another when the corresponding surface 88 of the filler 85 is adjacent to and facing the filler mounting surface 52. Thus, changing the orientation of the filler 85 changes which surface 88 thereof faces the filler mounting surface 52, thereby changing which sets of attachment features are used to attach the filler 85 to the filler mounting surface 52, thereby changing the position of the filler 85 relative to the filler mounting surface 52, thereby changing the distance that the filler 85 extends across the unoccupied portion 87.

For example, FIG. 1 illustrates two examples of installation configurations of the filler 85. In a first installation configuration (depicted in FIG. 1 by the filler 85 in solid lines), the filler 85 is in a first orientation with a first surface 88-1 thereof being closest to the filler mounting surface 52, and a filler attachment feature coupled to the first surface 88-1 is engaged with a corresponding cage attachment feature to attach the filler 85 to the filler mounting surface 52. This first installation configuration may be used when the module housing 22*a* is present. In this first installation configuration, the filler attachment feature coupled to the first surface 88-2 and the corresponding cage attachment feature hold the filler 85 at a first position relative to the cage 51 such that the filler 85 extends a first distance D1 across an opening of the unoccupied portion 87*a*. The distance D1 may be substantially the same as the height of the unoccupied portion 87*a* and thus the filler 85 in the first installation configuration extends across and covers the opening of the unoccupied portion 87*a*.

In contrast, in a second installation configuration (depicted in FIG. 1 by the filler 85 in dotted lines), the filler 85 is in a second orientation with a second surface 88-2 thereof being closest to the filler mounting surface 52, and a filler attachment feature coupled to the second surface 88-2 is engaged with a corresponding cage attachment feature to attach the filler 85 to the filler mounting surface 52. This second installation configuration of the filler 85 may be used, for example, when the module housing 22*b* is present. In this second installation configuration, the filler attachment feature coupled to the second surface 88-2 and the corresponding cage attachment feature hold the filler 85 at a second position relative to the cage 51 such that the filler 85 extends a second distance D2 across an opening of the unoccupied portion 87*b*. The distance D2 may be substantially the same as the height of the unoccupied portion 87*b* and thus the filler 85 in the second installation configuration extends across and covers the opening of the unoccupied portion 87*b*. Accordingly, the differently sized unoccupied portions 87*a* and 87*b*, which result from using the differently dimensioned module housings 18*a* and 18*b*, can be accommodated by the same filler 85 by changing the installation configuration of the filler 85. In some examples, the first surface 88-1 and second surface 88-2 are diametrically opposite surfaces of the filler 85 (e.g., top and bottom surfaces) such hat the filler 85 can be changed between the first installation configuration and the second installation configuration by rotating the filler 85 by 180 degrees about an axis thereof.

Turning now to FIGS. 2-9B, example drive cages 250*a* and 250*b* will be described. The drive cages 250*a* and 250*b* are example configurations of the drive cages 50*a* and 50*b* and may be used in information processing devices such as the information processing device 10. Thus, some components of the drive cages 250*a* and 250*b* correspond to (i.e., are the same as, similar to, and/or example configurations of) components of the drive cages 50*a* and 50*b* described above. The components of the drive cages 250*a* and 250*b* and the drive cages 50*a* and 50*b* which correspond to one another, respectively, are given reference numbers with the same last two digits. The descriptions above of the components of the drive cages 50*a* and 50*b* are applicable to the corresponding components of the drive cages 250*a* and 250*b*, respectively (unless otherwise indicated or logically contradictory), and thus duplicative descriptions of some aspects already described above are omitted below. In addition, some of the components of the drive cage 250*a* are the same as components of the drive cage 250*b*, and these components are given the same reference numbers herein and are described only once to avoid duplicative description.

FIGS. 2-9B show the drive cages 250*a* and 250*b* in various perspectives and in various states, and aspects thereof may be visible in multiple of the figures. The description below will refer to the figures as and when they are relevant to the aspect being described, rather than in strict numerical order. The description herein uses various directional/relational terms, such as top, bottom, left, right, front, rear, horizontal, vertical and other similar terms. These terms should be understood as referring to the objects as illustrated in the figures, but do not necessarily limit the orientations of the objects in relation to some external reference frame (such as the ground). For example, the side of an object that is the "top" side as illustrated in the figure and as described herein may appear as if it were the bottom of the object from the perspective of a ground-based external reference frame if the object is rotated 180 degrees relative to the ground. In other words, in practice the objects and be moved about in space, rotated, and oriented in any desired manner, and the directional terms used herein do not limit this. Up or similar terms refer generally to a +Z direction illustrated in the figures, and top refers to a portion of an object that is positioned farther along the +Z direction than other portions thereof. Down or similar terms refer generally to a −Z direction illustrated in the figures, and bottom refers to a portion of an object that is positioned farther along the −Z direction than other portions thereof. Left or similar terms refer generally to a +X direction illustrated in the figures, and a left side refers to a side of an object that is positioned farther along the +X direction than other portions thereof. Right or similar terms refer generally to a −X direction illustrated in the figures, and a right side refers to a side of an object that is positioned farther along the −X direction than other portions thereof. Rearward or similar terms refer generally to a +Y direction illustrated in the figures, and rear refers to portion of an object that is positioned farther along the +Y direction than other portions thereof. Forward or similar terms refer generally to a −Y direction illustrated in the figures, and front refers to portion of an object that is positioned farther along the −Y direction than other portions thereof.

In some cases, in which multiple instances of the same component are present, only one or a few of the instances of that component are labeled in the figures to avoid obscuring other features. One of ordinary skill in the art would understand in those cases in which multiple instances are shown and/or described but only one is labeled which elements in the figures correspond to other (unlabeled) instances of the component in question based on their appearance in the figures, based on the context provided in the written description, and based on the baseline knowledge of those of ordinary skill in the art.

Figure 3:
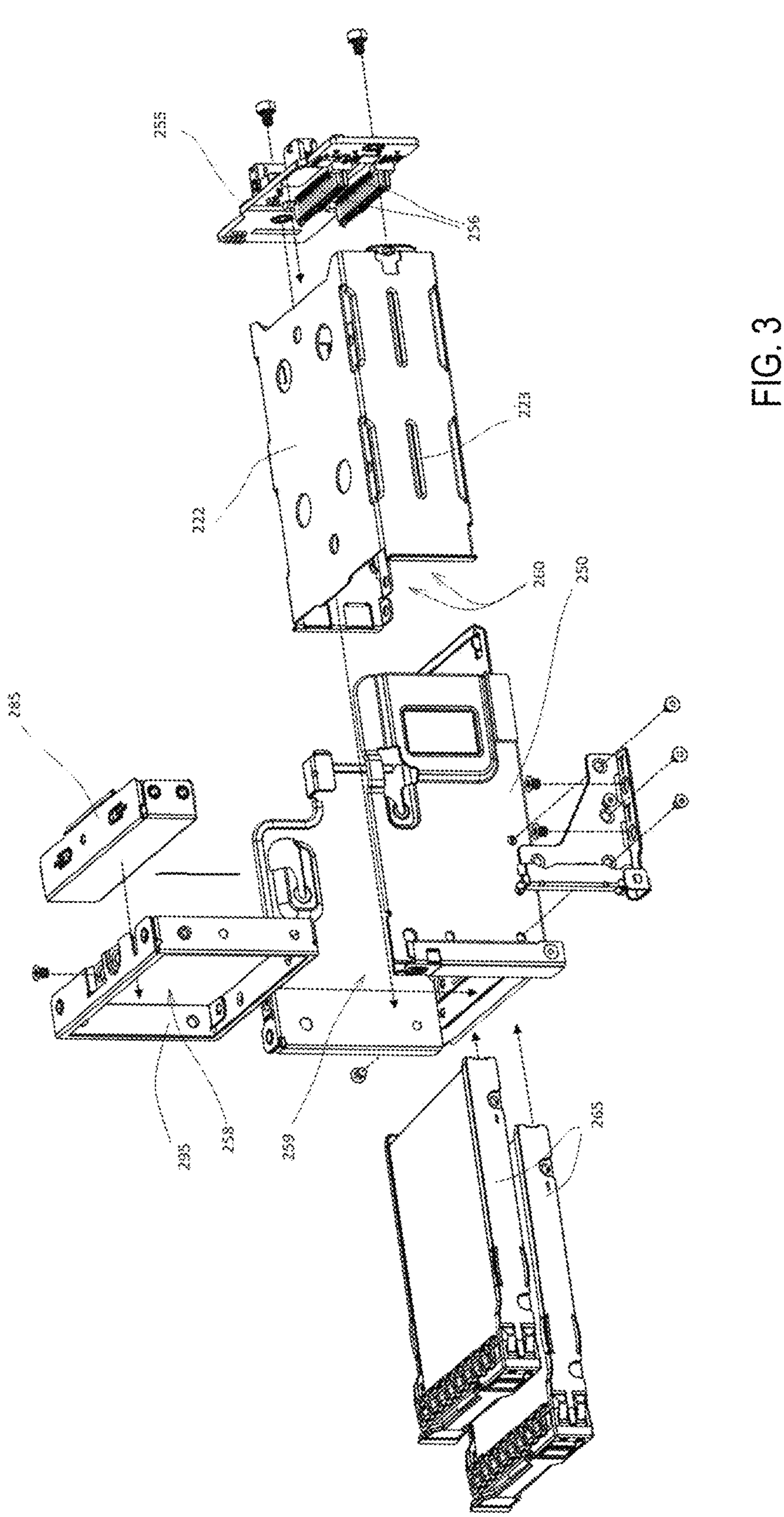
FIG. 3 is an exploded view of the drive cage and pluggable modules of FIG. 4.

As shown in FIG. 2, the information processing system 105 comprises an information processing device 110 and a drive cage 150. The information processing device 110 may be a computer (e.g., server), networking device, or any other type of information processing device. The information processing device 110 comprises a chassis 111, which comprises one or more walls, panels, and/or other structural members which support and house the components of the device 110. As shown in FIGS. 2-3, the drive cage 150 is configured to carry multiple media drives 165 (e.g., HDD, SDD, etc.). The media drives 165 may comprise an electronic module portion and a drive carrier portion, with the drive carrier portion providing a frame to support the electronic module portion, as well as engagement to engage with the bays 160, latching features including an ejection lever, as would be familiar to those in the art. The media drives 165 may comprise, in some examples, commercially available and/or industry standard form factor media drives. In certain example, the media drives 165 are removable modules such as storage drives, optical receivers, network interface cards (NIC), hardware accelerators, or any other removable modules deemed suitable.

Figure 4:
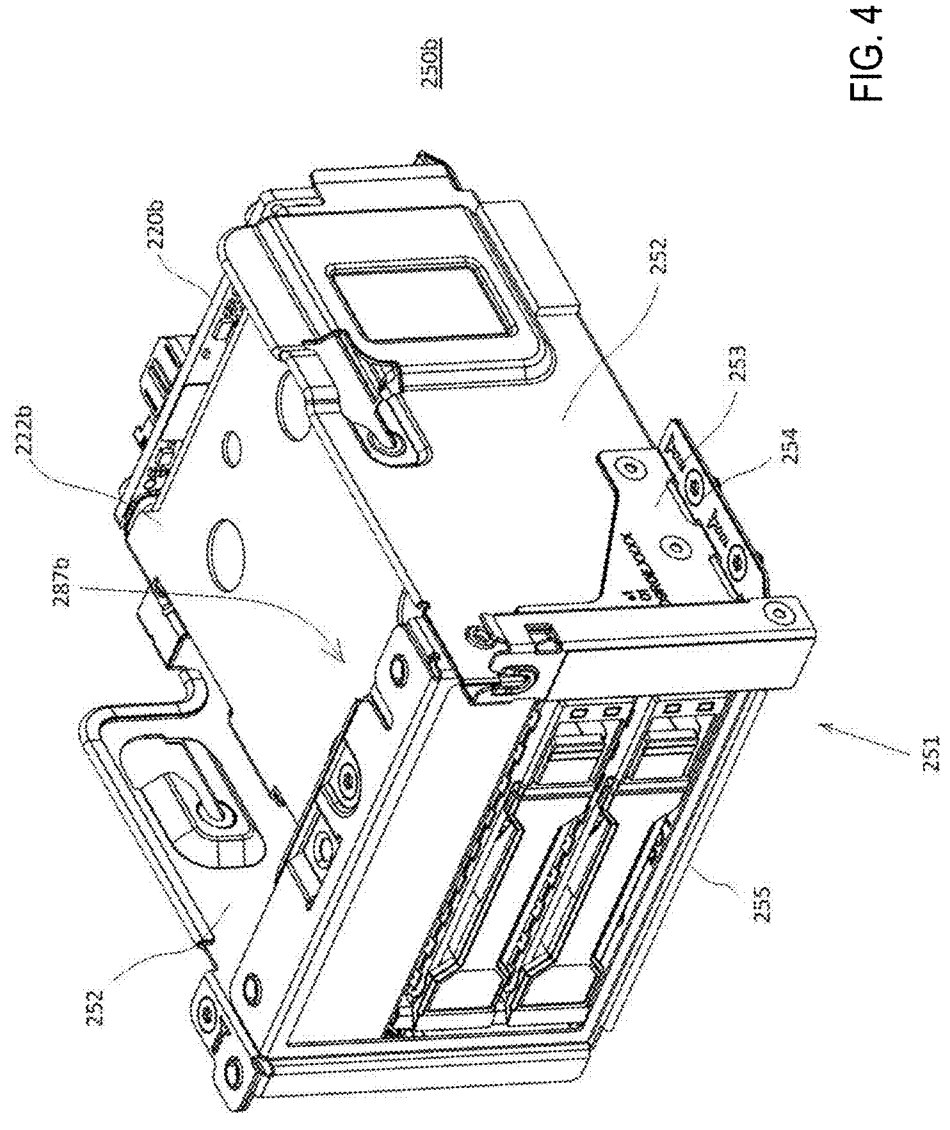
FIG. 4 is a perspective view of another drive cage comprising the same frame and filler as the drive cage of FIG. 2 but with the filler in a second installation configuration.

As shown in FIGS. 2 and 3, the drive cage 250*a* comprises a mounting cage 251, a filler 285 attached to the mounting cage 251, a module housing 222*a* attached to the mounting cage 251, and a backplane 220 mounted to the module housing 222*a*. As shown in FIG. 4, the drive cage 250*b* also comprises the same mounting cage 251 and the same filler 285 as the drive cage 250*a*. However, the drive cage 250*b* differs from the drive cage 250*a* in that the drive cage 250*a* comprises a module housing 222*b* and a backplane 255*b* instead of the module housing 222*a* and backplane 255*a*, with the module housing 222*b* and the backplane 255*b* being different in at least one dimension than the module housing 222*a* and backplane 255*a*, as will be described below. The drive cages 250*a* and 250*b* also differ from one another in that the filler 285 is in two different installation configurations in the drive cages 250*a* and 250*b* so as to accommodate differently sized unoccupied portions 287 of the drive cages 250*a* and 250*b*.

As shown in FIGS. 2-4, in both of the drive cages 250*a* and 250*b*, the mounting cage 251 comprises two side walls 252 and a bottom wall 255 extending therebetween, forming a box-like structure which has open front, top, and back sides. The mounting cage 251 also comprises a frame 295 displayed at a front side of the mounting cage 251 and which is attached to and extends between the side walls 252. The frame 295 comprises an opening in middle region thereof, such that the frame 295 defines and encircles an opening 258 into an interior space 259 of the mounting cage 251 through which drives 265 may be inserted into drive cage 250*a* or 250*b*. The mounting cage 251 also comprises a bracket 253 which is attached to one of the side walls 252 and which is configured to be attached to a chassis of an information process device via fasteners 254, thereby mounting the mounting cage 251 to the chassis. The mounting cage 251 then, in turn, supports the other components of the drive cage 250*a* or 250*b* relative to the chassis.

As shown in FIGS. 2-4, in both of the drive cages 250*a* and 250*b*, the filler 285 is attached to the frame 295 of the mounting cage 251. More specifically, the filler 285 is attached to a top plate 290 of the frame 295. However, as noted above, the filler 285 is attached in different installation configurations in the drive cages 250*a* and 250*b*, as will be described below.

The drive cages 250*a* and 250*b* are configured to carry multiple removable modules 265 (e.g., HDD, SDD, etc.) in a housing 222*a* or 222*b* accommodated by the cage 250*a* or 250*b*, respectively. As shown in FIGS. 2-4, the module housings 222*a* and 222*b* are each box-shaped structures configured to removably receive and support modules 265. Both module housings 222*a* and 222*b* comprise bays 260 to receive the modules 265, with each bay 260 comprising a volume inside the housing 222*a* or 222*b* which holds one of the modules 265. The module housings 222*a* and 222*b* include rails 223 formed in or attached to the side walls thereof, which engage with the modules 265 as they are inserted into bays 260 of the module housing 222*a* or 222*b* to align and guide the modules 265 into proper installation positions and to support the modules 265 once installed. The rails 223 define the boundary between adjacent bays 260. As shown in FIGS. 8B, 8D, the modules 222*a* and 222*b*, differ from one another in at least their height dimension, with the module 222*a* having a first height H1 and the module 222*b* having a second height H2, with H2>H1.

Figures 9A, 9B:
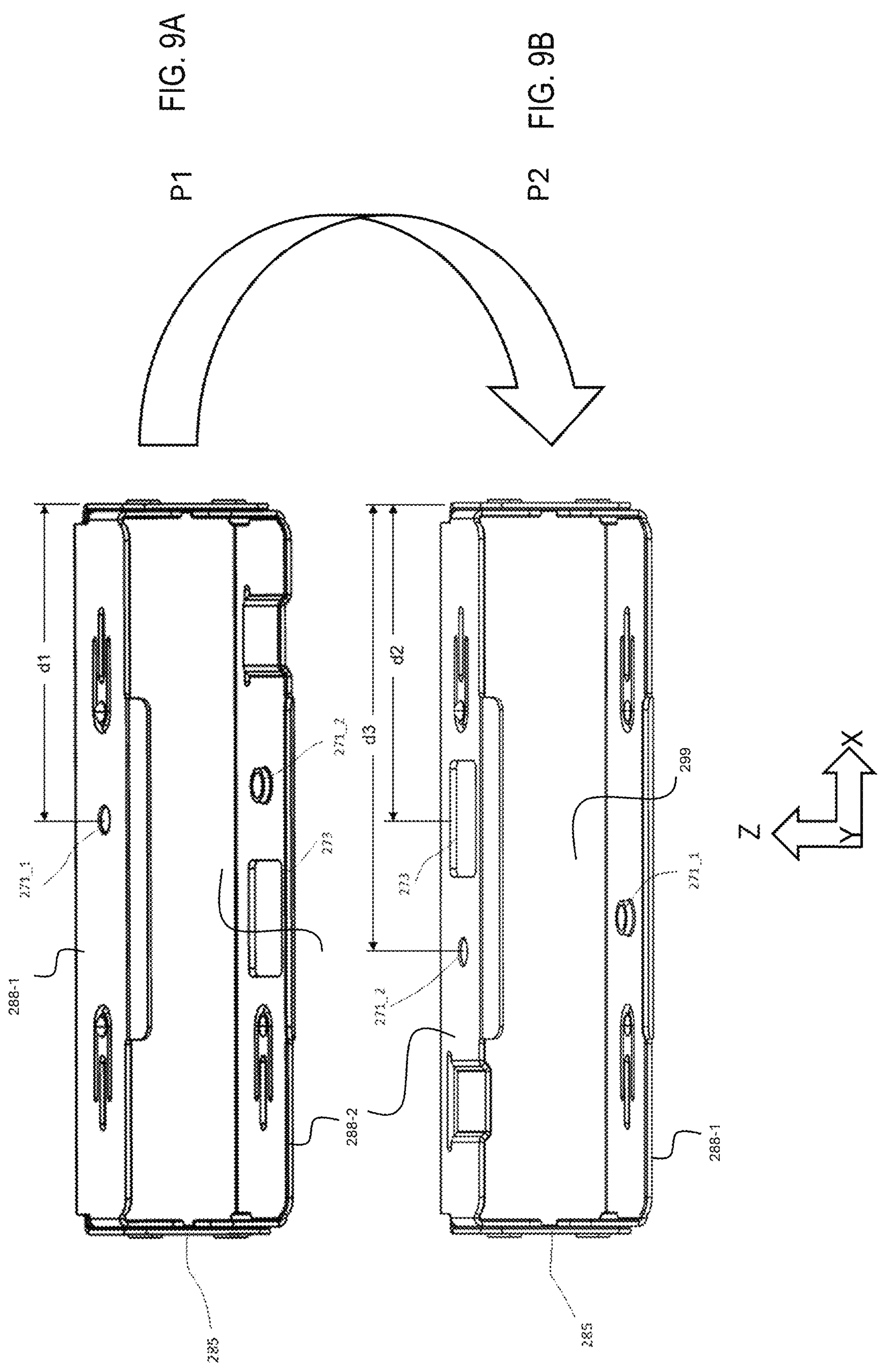
FIGS. 9A and 9B comprise perspective views of the filler of the drive cages of FIGS. 2 and 4 in isolation, with FIG. 9A showing the filler in a first orientation and FIG. 9B showing the filler in a second orientation.

The housings 222*a* or 222*b* may further attach to a backplane 220*a* or 220*b*, respectively, which is as a central hub that electrically connects pluggable modules 265 received within the housing 222 with other components of the information processing device (e.g., the CPU), allowing the pluggable modules 265 to communicate with the other components. The backplanes 220*a* and 220*b* each comprise connectors 256*a* and 256*b*, respectively, which are positioned to blind mate with electrical connectors of the modules 265 when the modules 265 are received in the housings 222*a* or 222*b*, respectively. In this example, the connectors 256*a* and 256*b* of the backplanes 220*a* and 220*b* are positioned differently than one another. In particular, as shown in FIGS. 9A and 9B, a pitch between the connectors differs, with the connectors 256*a* being separated by a distance d4 and the connectors 256*b* being separated by a distance d5, with d5>d4. In some examples, a difference in connector location may occur between two backplanes because they are designed to receive different form factors of pluggable modules. In other examples, a difference in connector location may occur between two backplanes designed to receive the same form factor of pluggable module, for example because one backplane may have additional features which take up more space on the board, thus necessitating a change in connector location. In some examples, this difference in connector location may, in turn, necessitate a difference in position of the modules 265 within the module housing 222*a* or 222*b*, and this difference in position of the modules 265 may necessitate differences in dimensions of the module housing 222*a* and 222*b* relative to one another. For example, the larger connector pitch d5 of the backplane 220*b* may necessitate the pluggable modules 265 to be spaced slightly farther apart in the pluggable module 222*b* (as compared to in pluggable module 222*a*), thus requiring the pluggable module 222*b* to have a larger height dimension (i.e., H2) than that the pluggable module 222*a* (i.e., H1).

The removable modules 265 may comprise an electronic module portion and a drive carrier portion to engage with the bays 260. The removable modules 265 may further comprise, in some examples, commercially available and/or industry standard form factor media drives. In certain examples, the removable modules 265 are removable modules such as storage drives, optical receivers, network interface cards (NIC), hardware accelerators, or any other removable modules deemed suitable. The modules 265 can be storage drives, which may include 3.5" or 2.5" drives, EDSFF form factor drives (which come in many flavors), etc.

In some examples, the drive cage 250 is configured to carry removable modules 265 stacked along the Z-axis. In FIGS. 2 and 4 the module housings 222*a* and 222*b* each comprise two bays 260 to receive two modules 265, but in other examples the module housings may be configured to receive there may be one, two, three or more modules 265 inserted in corresponding bays thereof.

As noted above, each drive cage 250*a* and 250*b* comprises a frame 295. A top portion of the frame 295 may be a top plate 290, and the top plate 290 may include one or more recess portions 270_1 and 2702, which may be indentations of the plate 290 protruding toward the interior space 259 of the mounting cage 251 (i.e., toward the housing 222*a* or 222*b*).

Figures 5A, 5B, 5C, 5D:
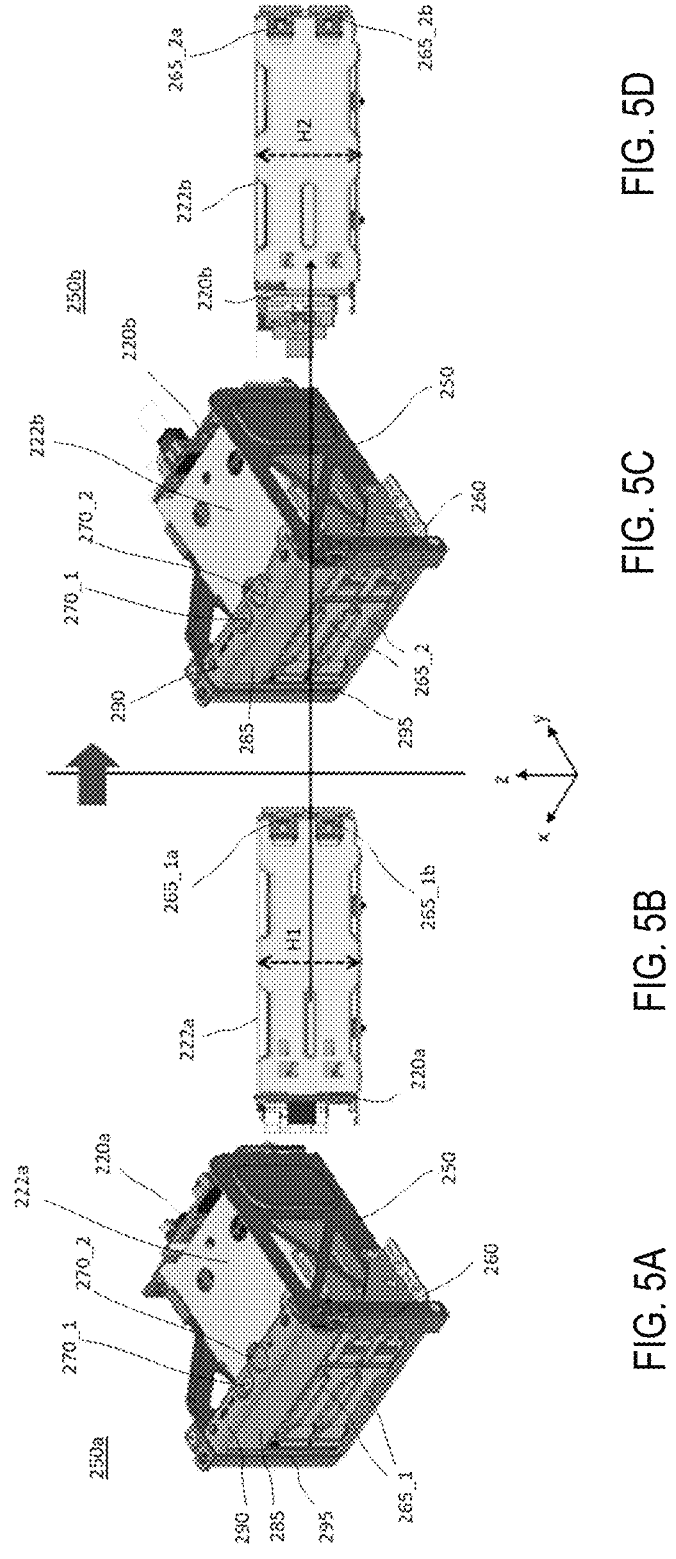

In the example shown in FIGS. 5A and 5D, pluggable modules 265_1*a* and 265_1*b* are accommodated by a housing 222*a* and connected to the backplane 220*a*, and H1 is the height of the housing 222*a* in the direction of the Z-axis. Similarly, in the example shown in FIGS. 5C and 5D, pluggable modules 265_2*a* and 265_2*b* are accommodated by a housing 222*b* and connected to the backplane 220*b*, resulting in H2 being the height of the housing 222*b* in the direction of the Z-axis. In the illustrated example, H2 is greater than H1.

Figure 6A:
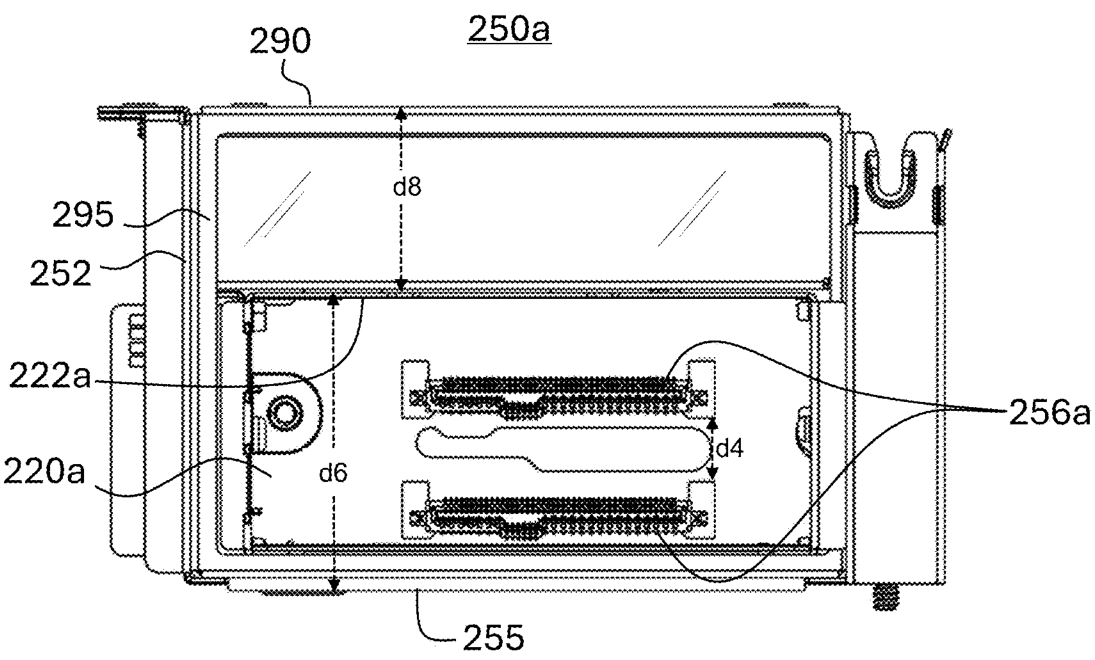
Figure 6B:
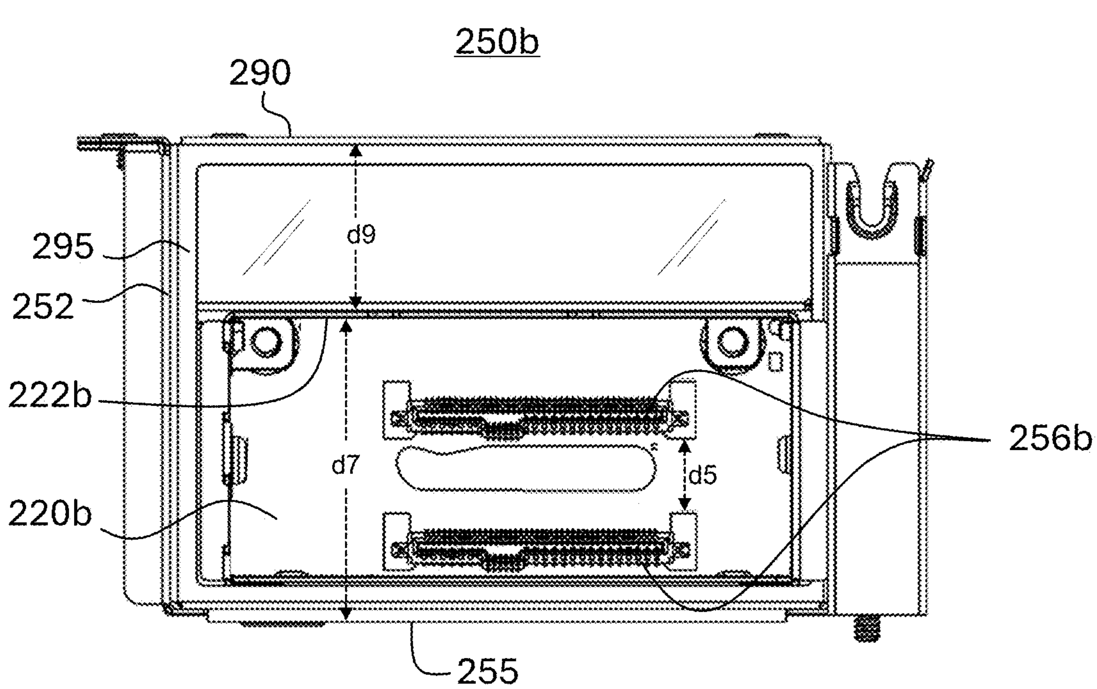

In one example, the drive cage 250, the frame 295, the top plate 290 of the frame 295, and accordingly, the one or more recess portions 270_1 and 270_2 are the same components in the drive cages 250*a* and 250*b* of FIGS. 5A-5D. At the same time, the housing 222*b* of the height H2, shown in FIG. 5D, occupies a greater portion of the frame 295 (and drive cage 250) in the Z-axis direction than the housing 222*a* of the height H1, shown in FIG. 5A. The height of the housing may vary due to different sized pluggable modules used, or due to different pitched modules inserted into backplanes of different heights. As a result, the remaining portion of the frame 295 changes in size (height in the direction of the Z-axis). As shown in FIG. 6A, the height H1 of the housing 222*a* results in a top surface of the housing 222*a* being located a distance d6 from the bottom of the drive cage 250, which results in there being a distance d8 between the top surface of the housing 222*a* and the top of the drive cage 250 (i.e., the top surface of the top plate 290). In contrast, as shown in FIG. 6B, the greater height H2 of the housing 222*b* results in a top surface of the housing 222*b* being located a greater distance d7 from the bottom of the drive cage 250 (d7>d6), which results in there being a smaller distance d9 between the top surface of the housing 222*b* and the top of the drive cage 250 (d9<d8).

The spaces of the remaining portions of the drive cage 250*a* or 250*b* which are not occupied by the module housing 222*a* or 222*b* may be referred to herein as the unoccupied portion 287*a* or 287*b*, respectively. The unoccupied portion 287*a* extends the distance d8 between the top of the module hosing 222*a* and the top of the drive cage 250*a*, whereas the unoccupied portion 287*b* extends the distance d9 between the top of the module hosing 222*a* and the top of the drive cage 250*b*. A portion of the opening 258 of the frame 295 aligns with the unoccupied portions 287*a* and 287*b*, and thus if the filler 285 were not present the unoccupied portions 287*a* and 287*b* would be open to the external environment through the frame, which could disrupt airflow and allow EMI leakage. The portion of the opening 258 of the frame 295 which aligns with the unoccupied portion 287*a* or 287*b* may be referred to herein as an opening of or to the unoccupied portion 287*a* or 287*b*. The filler 285 is disposed in the unoccupied portions 287*a* or 287*b* and attached to the frame 295 so as to extend across and substantially cover the openings of the unoccupied portions 287*a* or 287*b*. Notably these unoccupied portions 287*a* and 287*b*, although having different height dimensions, can be covered by one and the same filler 285, both in FIGS. 8A and 8B, regardless of the different dimensions of the unoccupied spaces 287*a* and 287*b* between the structures shown in FIGS. 5B and 5D. In other words, the height of the frame 295 reduced by H1 in FIG. 5B and H2 in FIG. 5D results in differently sized empty spaces; however, in one example, the same filler 285 piece is inserted in both empty spaces in FIG. 5A and in FIG. 5D, as will be further discussed in detail.

Figure 7:
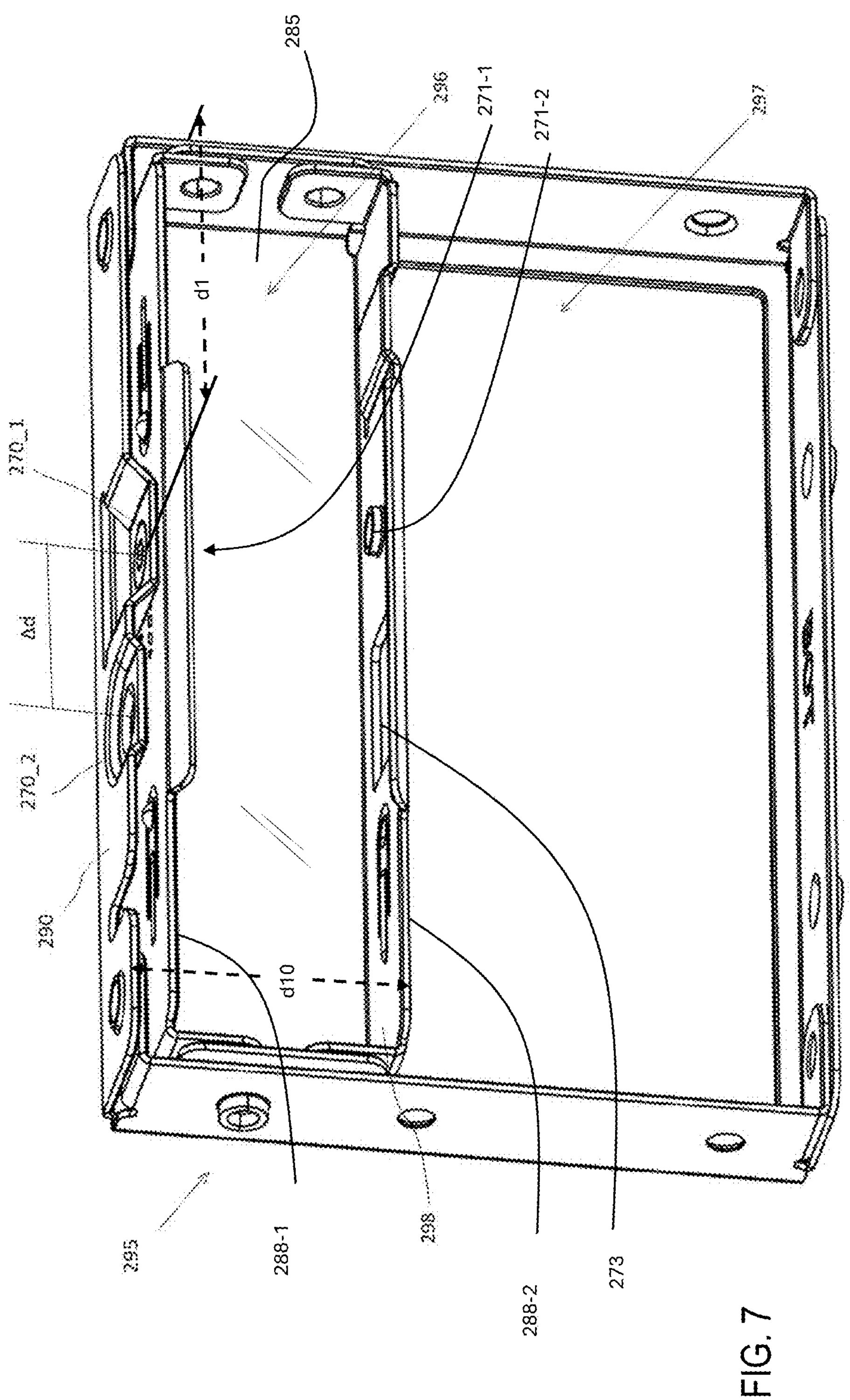
FIG. 7 is a perspective view of the frame and the filler of the drive cage of FIG. 2 in isolation, with the filler in the first installation configuration.
Figure 8:
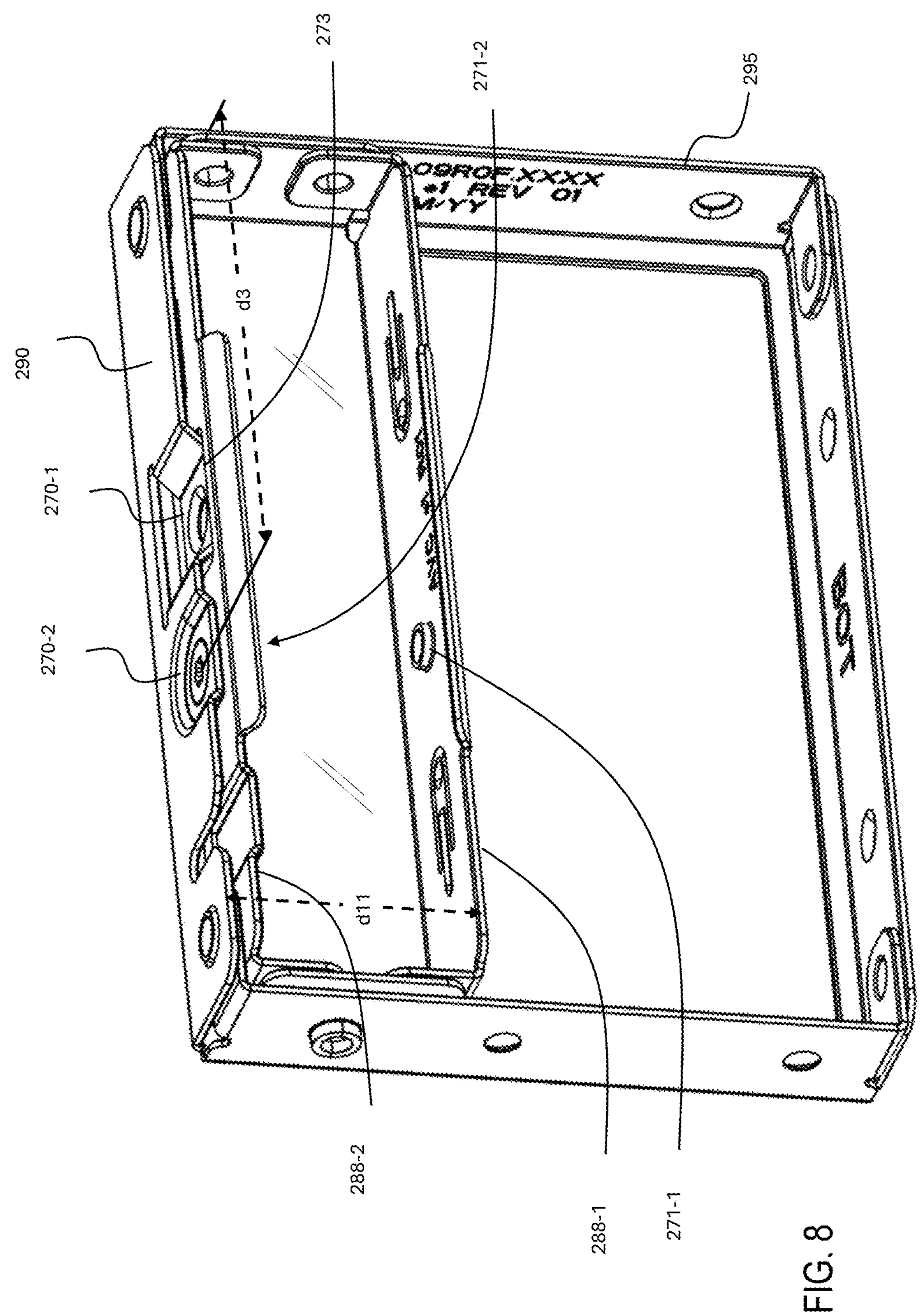
FIG. 8 is a perspective view of the frame and the filler of the drive cage of FIG. 4 in isolation, with the filler in the second installation configuration.

The filler 285 is installed in two different installation configurations in the drive cages 250*a* and 250*b* to allow it to cover the differently sized openings of the unoccupied spaces 287*a* and 287*b*. For example, the filler 285 can be attached to the frame 290 in one of two orientations, with FIG. 7 showing the filler 285 attached to the frame 290 in a first orientation (a first installation configuration) and FIG. 8 showing the filler 285 attached to the frame 290 in a second orientation (a second installation configuration). As shown in FIGS. 9A and 9B, the filler 285 can be changed between these two orientations by rotating the filler 285 180 degrees from orientation P1 of the filler 285 to orientation P2 of the filler 285 around Y-axis, which is perpendicular to the X-Z plane of the projected view of the filler 285. The filler 285 may be in a shape of a rectangular prism or a rectangular cuboid, where at least two sides include screw holes 271_1 and 2712, drilled for mounting the filler 285 to a top plate 290 of the frame 295. In other examples, the mounting structure(s) of the filler 285 may be rivets, screws, grooves, or any other protrusions or indentations deemed suitable. The mounting structures of the filler 285, such as screw holes 271_1 and 271_2 may be formed on two or more sides of the filler 285. Each of the sides of the filler 85 may include one or more mounting structure, e.g., one or more screw holes. In the example shown in FIGS. 2-9B, the screw holes 271_1 and 271_2 are located on two opposite sides 288-1 and 288-2 of the filler 285. One of the sides 288-2, for example the surface of the filler 285 where the screw hole 271_2 is formed, may additionally include a keyhole 273.

The orientations P1 and P2 may be two mounting orientations of the filler 285 in two instances. Orientation P1 may be the orientation of the filler 285 in the first installation configuration of FIG. 7 while the orientation P2 may be the orientation of the filler 285 in the second installation configuration of FIG. 8. These different orientations of the filler 285 may be used depending on which module housing 222*a* or 222*b* is mounted to the mounting cage 251. For example, orientation P1 may be the orientation used in the drive cage 250*a* which comprises the module housing 222*a*, and this orientation may allow the filler 285 to fit the opening into the unoccupied space 287*a*. At the same time, orientation P2 may be the orientation used in the drive cage 250*a* which comprises the module housing 222*a*, and this orientation may allow the filler 285 to fit the opening into the unoccupied space 278*a*. Depending on which orientation of the filler 285 is used, different attachment features (e.g., recess portions 270-1 and 270-2 and holes 271-1 and 271-2) are used to mount the filler 285 to the frame 290.

Because different attachment features (recess portions 270-1 and 270-2) are used to attach the filler 285 to the frame 295 in the different orientations P1 and P2, and because the recess portions 270-1 and 270-2 have different heights relative to the top plate 295, changing the filler 285 between the orientation P1 and P2 also results in a change in the position of the filler 285 relative to the frame 295. As shown in FIG. 7, in the first orientation P1, the bottom surface of the filler 285 is a distance d10 from the top plate 295. In contrast, as shown in FIG. 8, in the second orientation P2, the bottom surface of the filler 285 is a distance d11 from the top plate 295, where d11<d10. In other words, in the second orientation, the filler 285 is positioned slightly lower along the Z-axis direction from the top plate 290 as compared to the first orientation. A difference in height of the filler 285 between the two installation configurations is equal to a difference in the depths of the recess portion 270-1 and 260-2. These differences in position of the filler 285 allow the filler to fit the differently sized unoccupied portions 287*a* and 287*b*. Accordingly, since H2 is greater than H1, position P2 would place the filler 285 higher and closer to the top plate 290 of the frame 295 in the Z-axis direction than position P1, as will be explained later in detail.

The positions of the recess portions 270-1, 270-2, and screw holes 271-1 and 271-2 are mutually arranged so that the screw hole 271-1 is aligned with the recess portion 270-1 when in orientation P1 whereas the screw hole 271-2 is aligned with the recess portion 270-2 when in the orientation P2. In the position P1, the distance of the screw hole 271_1 from one of the sides of the frame 295 is d1, and in position P2, the distance of the screw hole 271_2 from the same side of the frame 295 is d3, where d3−d1=Δd. In one example, the distance Δd is substantially equal to a distance between the centers of recess portions 270_1 and 270_2, shown in FIG. 78. In other words, as shown in FIG. 7, the screw hole of the recess portion 270-1 is located the same distance d1 from a side of the frame 295 as is the screw hole 271-1, so that the holes align and a screw 272 (or other fastener) can be inserted therethrough to attach the filler 285 to plate 295. On the other hand, as shown in FIG. 8, the screw hole of the recess portion 270-2 is located the same distance d3 from a side of the frame 295 as is the screw hole 271-2, so that the holes align and a screw 272 (or other fastener) can be inserted therethrough to attach the filler 285 to plate 295. At the same time, in orientation P2, the distance of the center of the keyhole 273 from the same side of the frame 295 is d2, which is substantially equal to d1, d1 being the distance of the screw hole 271_1 located on the opposite side of the filler 285 from the keyhole 273 and also the distance of the recess portion 270-1 from the same side. This allows the recess portion 270-1 to be received into the keyhole 273 when the filler 285 is attached to the frame 295 in the sconed orientation P2. In other words, the keyhole 273 allows the side 288-2 of the filler 285 to pass upward beyond the recess portion 270-1 so that the side 288-2 can engage with the recess portion 270-2, which is located at a greater height than the recess portion 270-1. Without the keyhole 273, the recess portion 270-1, which protrudes farther downward than the recess portion 270-2, would contact the side 288-2 and prevent it from moving farther upward, thus preventing engagement of the side 288-2 with the recess portion 270-2.

The example of FIGS. 7 and 8 illustrates the frame 295 of the drive cage 250 that includes a top frame portion 296 and a bottom frame portion 297. The top frame portion 296 is configured to accommodate the filler 285 in different positions shown in FIGS. 7 and 8, and the bottom frame portion 297 is configured to accommodate the housings 222_1 or 222_2 with the pluggable modules 265_1 or 265_2.

In one example, the top frame portion 296 is configured to seat the filler 285 in different positions P respective to the frame 295. The internal surface of the top plate 290 is the mounting surface used for affixing the filler 285 once the filler 285 is inserted into the top frame portion 296. The mounting interface of the top plate 290 of the frame 295 includes the recess portions 270_1 and 270_2 that protrude from the top plate 290 into a space of the top frame portion 296 in order to attach to the filler 285. The recess portions 270_1 and 270_2 may be used for two different positions of the filler 285, i.e., in two different instances of mounting the filler 285 in the top frame portion 296. In particular, the recess portion 270_1 may be used for mounting the filler 285 in position P1, and the recess portion 270_2 may be used for mounting the filler 285 in position P2, shown in FIG. 7.

In one example, the distance of the recess portion 270_1 from an inner side of the frame 295 can be substantially equal to distance d1 of the screw hole 271_1 from the same inner side of the frame 295, thereby aligning the recess portion 270_1 and the screw hole 271_1 along the Z-axis. Therefore, a latch can be mounted through the recess portion 270_1 to be affixed to the screw hole 271_1 in position P1 of the filler 285. Similarly, the distance of the recess portion 270_2 from an inner side of the frame 295 can be substantially equal to distance d3 of the screw hole 271_2 from the same inner side of the frame 295, thereby aligning the recess portion 270_2 and the screw hole 271_2 along the Z-axis. Accordingly, an attachment mechanism such as a screw can be mounted through the recess portion 270_2 to be affixed to the screw hole 2712 in position P2 of the filler 285. Hence, the recess portions 270_1 and 270_2 are spaced apart at the distance Δd (d3−d1 in FIG. 7), in order to be aligned at the screw holes of the filler respectively at positions P1 and P2.

In one example, the recess portion 270_1 protrudes deeper into the top frame portion 296 than the recess portion 270_2; accordingly, the recess portion 270_1 can attach to the filler 285 at a lower interface height than the shallower protruding recess portion 270_2. Consequently, position P2 of the filler 285 would result in the filler 285 being closer to the top plate 290, thus allowing the housing 222_2 of a greater height H2 to be accommodated with the filler 275 than the housing 222_1 of the smaller height H1. Nonetheless, in position P2, in order to avoid the deeper recess portion 270_1 (intended for attachment of the filler 85 in position P1) from undesirably butting against the top surface of the filler 285, the filler 285 includes the keyhole 273. The keyhole 273 may be used in position P2 of the filler 285, when the recess portion 270_2 attaches to the screw hole 271_2. In such an instance, the deeper protruding recess portion 270_1 is not used for mounting; instead, the recess portion 270_1 penetrates into the body of the filler 285 via the keyhole 273, thereby allowing the recess portion 270_2 to reach the screw hole 271_2 for affixation.

In instances when the filler 285 mounts to the top plate 290 at a lower height, such as in position P1 for example, a gap may be created between the top surface of the filler 285 and the top plate 290 of the frame 295. Any such gap may cause disturbance that affects the electrical circuits in the drive cage 250 due to either electromagnetic induction or electromagnetic radiation emitted from an external source, such as electromagnetic interference (EMI), which can disrupt the performance of components carried by the cage 250. In order to prevent any such disturbance, the frame 295 may include a shielding for the gap, such as a bezzle 299, shown in FIG. 4.

It is to be understood that both the general description and the detailed description provide examples that are explanatory in nature and are intended to provide an understanding of the present disclosure without limiting the scope of the present disclosure. Various mechanical, compositional, structural, electronic, and operational changes may be made without departing from the scope of this description and the claims. In some instances, well-known circuits, structures, and techniques have not been shown or described in detail in order not to obscure the examples. Like numbers in two or more figures represent the same or similar elements.

In addition, the singular forms "a," "an," and "the" are intended to include the plural forms as well, unless the context indicates otherwise. Moreover, the terms "comprises," "comprising," "includes," and the like specify the presence of stated features, steps, operations, elements, and/or components but do not preclude the presence or addition of one or more other features, steps, operations, elements, components, and/or groups. Components described as connected may be electronically or mechanically directly connected, or they may be indirectly connected via one or more intermediate components, unless specifically noted otherwise. Mathematical and geometric terms are not necessarily intended to be used in accordance with their strict definitions unless the context of the description indicates otherwise, because a person having ordinary skill in the art would understand that, for example, a substantially similar element that functions in a substantially similar way could easily fall within the scope of a descriptive term even though the term also has a strict definition.

And/or: Occasionally the phrase "and/or" is used herein in conjunction with a list of items. This phrase means that any combination of items in the list—from a single item to all of the items and any permutation in between—may be included. Thus, for example, "A, B, and/or C" means "one of {A}, {B}, {C}, {A, B}, {A, C}, {C, B}, and {A, C, B}".

Elements and their associated aspects that are described in detail with reference to one example may, whenever practical, be included in other examples in which they are not specifically shown or described. For example, if an element is described in detail with reference to one example and is not described with reference to a second example, the element may nevertheless be claimed as included in the second example.

Unless otherwise noted herein or implied by the context, when terms of approximation such as "substantially," "approximately," "about," "around," "roughly," and the like, are used, this should be understood as meaning that mathematical exactitude is not required and that instead a range of variation is being referred to that includes but is not strictly limited to the stated value, property, or relationship. In particular, in addition to any ranges explicitly stated herein (if any), the range of variation implied by the usage of such a term of approximation includes at least any inconsequential variations and also those variations that are typical in the relevant art for the type of item in question due to manufacturing or other tolerances. In any case, the range of variation may include at least values that are within ±1% of the stated value, property, or relationship unless indicated otherwise.

Further modifications and alternative examples will be apparent to those of ordinary skill in the art in view of the disclosure herein. For example, the devices and methods may include additional components or steps that were omitted from the diagrams and description for clarity of operation. Accordingly, this description is to be construed as illustrative only and is for the purpose of teaching those skilled in the art the general manner of carrying out the present teachings. It is to be understood that the various examples shown and described herein are to be taken as exemplary. Elements and materials, and arrangements of those elements and materials, may be substituted for those illustrated and described herein, parts and processes may be reversed, and certain features of the present teachings may be utilized independently, all as would be apparent to one skilled in the art after having the benefit of the description herein. Changes may be made in the elements described herein without departing from the scope of the present teachings and following claims.

It is to be understood that the particular examples set forth herein are non-limiting, and modifications to structure, dimensions, materials, and methodologies may be made without departing from the scope of the present teachings.

Other examples in accordance with the present disclosure will be apparent to those skilled in the art from consideration of the specification and practice of the invention disclosed herein. It is intended that the specification and examples be considered as exemplary only, with the following claims being entitled to their fullest breadth, including equivalents, under the applicable law.

What is claimed is:

1. An information processing system comprising:

a chassis;

information processing circuitry housed in the chassis; and a drive cage comprising a mounting cage attached to the chassis, a module housing attached to the mounting cage, and a filler, wherein the module housing is configured to removably receive at least one pluggable module, wherein an unoccupied portion of the drive cage is defined between the module housing and the mounting cage, the unoccupied portion having an opening, wherein the filler is configured to be attachable to the mounting cage in a plurality of installation configurations and to, when attached to the mounting cage, extend a distance across the opening of the unoccupied portion, wherein the distance is variable dependent upon which of the installation configurations the filler is attached in, wherein the mounting cage comprises a frame portion, wherein the frame portion comprises a plurality of frame attachment features configured to individually engage with the filler to attach the filler to the frame portion in respectively corresponding installation configurations of the installation configurations, and wherein the frame attachment features have mutually different vertical positions relative to a top plate of the frame portion.

2. The information processing system of claim 1, wherein the installation configurations respectively comprise different positions of the filler relative to the mounting cage such that the distance is variable dependent upon which of the positions the filler is in.

3. The information processing system of claim 1, wherein the installation configurations respectively comprise different poses of the filler relative to the mounting cage such that the distance is variable dependent upon which pose the filler is in, each of the poses comprises combination of a position and an orientation of the filler relative to the mounting cage.

4. The information processing system of claim 1, wherein the installation configurations respectively comprise different orientations of the filler relative to the mounting cage such that the distance is variable dependent upon which of the orientations the filler is in.

5. The information processing system of claim 4, wherein the orientations include a first orientation and a second orientation rotated 180 degrees around a filler axis relative to the mounting cage.

6. The information processing system of claim 1, wherein the frame attachment features comprise one or more recess portions recessed from the top plate toward the module housing, the one or more recess portions having mutually different depths relative to the top plate.

7. The information processing system of claim 1, wherein the frame attachment features comprise one or more protruding portions protruding from the top plate away from the module housing, the one or more protruding portions having mutually different heights relative to the top plate.

8. The information processing system of claim 1, wherein each frame attachment feature of the plurality of frame attachment features comprises or is configured to receive a corresponding latch to attach the filler to the frame portion.

9. The information processing system of claim 1, wherein the plurality of frame attachment features comprise:

a first frame attachment feature at a first vertical position and configured to engage with the filler to attach the filler to the frame portion in a first installation configuration of the plurality of installation configurations; and a second frame attachment feature at a second first vertical position and configured to engage with the filler to attach the filler to the frame portion in a second installation configuration of the plurality of installation configurations.

10. The information processing system of claim 9, wherein the filler comprises a first wall comprising a first filler attachment feature and a second wall comprising a second filler attachment feature, wherein in the first installation configuration the first wall faces the top plate and the first filler attachment feature engages the first frame attachment feature, and wherein in the second installation configuration the second wall faces the top plate and the second filler attachment feature engages the second frame attachment feature.

11. The information processing system of claim 10, wherein the first and second installation configurations comprise a first orientation of the filler and a second orientation of the filler, rotated 180 degrees around a filler axis relative to the mounting cage.

12. The information processing system of claim 10, wherein in the first installation configuration, a gap is formed between the filler and the top plate of the frame portion, and wherein the frame portion includes a bezzle that covers the gap from an external side of the drive cage.

13. The information processing system of claim 12, wherein the second wall of the filler includes a keyhole, and wherein in the second installation configuration, the first frame attachment feature penetrates through the keyhole into an interior space of the filler allowing the second wall of the filler to move beyond the first vertical position and allowing the second filler attachment feature to engage with the second frame attachment feature.

14. An adjustable support assembly of a drive cage of an information processing device, comprising:

a mounting cage configured to attach to a chassis of an information processing device and to interchangeably receive a plurality of module housings attached thereto, each of the module housings configured to receive at least one pluggable module; and a filler configured to be attachable to the mounting cage in a plurality of installation configurations, wherein, on condition of one of the module housings being attached to the mounting cage, an unoccupied portion of the drive cage is defined between the module housing and the mounting cage, wherein a size of the unoccupied portion is variable depending on which of the module housings is attached to the mounting cage, wherein the filler is configured to, when attached to the mounting cage, extend a distance across an opening of the unoccupied portion, wherein the distance is variable dependent upon which of the installation configurations the filler is attached in, wherein the mounting cage comprises a frame portion, wherein the frame portion comprises a plurality of frame attachment features configured to individually engage with the filler to attach the filler to the frame portion in respectively corresponding installation configurations of the installation configurations, and wherein the frame attachment features have mutually different vertical positions relative to a top plate of the frame portion.

15. The adjustable support assembly of claim 14, wherein the module housings each have a first dimension and the first dimensions of the respective module housings vary among the module housings such that the size of the unoccupied portion is variable depending on which of the module housings is attached to the mounting cage.

16. The adjustable support assembly of claim 14, wherein the installation configurations correspond respectively to the module housings such that, on condition of one of the module housings being attached to the mounting cage and the filler being attached to the mounting cage in the corresponding installation configuration, the filler extends across and covers an opening to the unoccupied portion.

17. The adjustable support assembly of claim 15, wherein the module housings include respective backplanes, and wherein at least one of:

one or more dimensions of the backplanes vary among the backplanes of the module housings; or form factors of respective pluggable modules the module housings are configured to receive are variable among the module housings.

18. A method comprising:

attaching a mounting cage for a drive cage to a chassis of an information processing device;

attaching a module housing to the mounting cage such that an unoccupied portion is defined between the module housing and the mounting cage, wherein module housing is one of a plurality of module housings which are interchangeably attachable to the mounting cage and have varying dimensions among one another, wherein each of the module housings is configured to receive at least one pluggable module; and attaching a filler to the mounting cage in an installation configuration, wherein the filler is configured to be interchangeably attachable to the mounting cage in a plurality installation configurations including the installation configuration, wherein the filler is configured to extend a distance across an opening of the unoccupied portion that varies depending upon which of the installation configurations is selected, wherein the mounting cage comprises a frame portion, wherein the frame portion comprises a plurality of frame attachment features configured to individually engage with the filler to attach the filler to the frame portion in respectively corresponding installation configurations of the installation configurations, and wherein the frame attachment features have mutually different vertical positions relative to a top plate of the frame portion.

19. The method of claim 18, wherein the module housings each have a first dimension and the first dimensions of the respective module housings vary among the module housings such that a size of the unoccupied portion is variable depending on which of the module housings is attached to the mounting cage.

20. The adjustable support assembly of claim 14, wherein the installation configurations respectively comprise different orientations of the filler relative to the mounting cage such that the distance is variable dependent upon which of the orientations the filler is in.

* * * * *